United States Patent [19]

Fox, III et al.

[11] Patent Number: 5,128,831
[45] Date of Patent: Jul. 7, 1992

[54] HIGH-DENSITY ELECTRONIC PACKAGE COMPRISING STACKED SUB-MODULES WHICH ARE ELECTRICALLY INTERCONNECTED BY SOLDER-FILLED VIAS

[75] Inventors: Angus C. Fox, III, Boise; Warren M. Farnworth, Nampa, both of Id.

[73] Assignee: Micron Technology, Inc., Boise, Id.

[21] Appl. No.: 785,665

[22] Filed: Oct. 31, 1991

[51] Int. Cl.⁵ ............................................. H05K 7/00
[52] U.S. Cl. ...................................... 361/396; 357/74; 357/75; 361/393; 361/412; 439/69; 439/74
[58] Field of Search ........................ 174/255, 261, 52.1, 174/52.4, 52.6; 357/74, 75, 80; 361/393, 394, 396, 412, 414, 403, 418; 439/69, 72, 74, 75

[56] References Cited

U.S. PATENT DOCUMENTS

| | | | |
|---|---|---|---|
| 3,764,856 | 10/1973 | Martin | 361/396 |
| 3,829,601 | 8/1974 | Jeanotte et al. | 439/55 |
| 3,904,934 | 9/1975 | Martin | 361/396 |
| 4,574,331 | 3/1986 | Smolley | 439/74 |
| 4,581,679 | 4/1986 | Smolley | 439/74 |
| 4,764,846 | 8/1988 | Go | 361/388 |
| 4,773,868 | 9/1988 | Heinecke | 439/69 |
| 4,833,568 | 5/1989 | Berhold | 361/396 |
| 4,894,706 | 1/1990 | Sato et al. | 357/72 |
| 4,983,533 | 1/1991 | Go | 357/75 |
| 4,988,306 | 1/1991 | Hopfer, III | 439/74 |
| 5,007,841 | 4/1991 | Smolley | 439/66 |
| 5,019,945 | 5/1991 | Smolley | 361/393 |
| 5,030,110 | 7/1991 | Groves et al. | 439/69 |

FOREIGN PATENT DOCUMENTS

| | | | |
|---|---|---|---|
| 0073489 | 3/1983 | European Pat. Off. | 29/837 |
| 0086159 | 3/1990 | Japan | 357/75 |

OTHER PUBLICATIONS

IBM Technical Disclosure Bulletin "Universal Electronic Package" by L. S. Goldmann vol. 27 No. 6 Nov. 1984.

Primary Examiner—Leo P. Picard
Assistant Examiner—D. Sparks
Attorney, Agent, or Firm—Angus C. Fox, III

[57] ABSTRACT

A high-density package containing identical multiple IC chips is disclosed. The package is assembled from submodules interleaved with frame-like spacers. Each submodule comprises a rectangular, wafer-like substrate. The substrate has a planar metalization pattern, comprising conductive traces, on its upper surface. A single memory chip is face-bonded to this metalization pattern. Each of the traces extends from beneath a chip bonding pad, with which it is in electrical communication, and runs to the substrate periphery, where it terminates in one or more solderable package interconnection pads (PIP's). Each PIP is associated with a single substrate via, which extends through the pad to the lower surface of the substrate. During package assembly, a spacer is adhesively bonded to the peripheral upper surface of each sub-module, with the frame surrounding the chip. The spacer also has a plurality of vias which are coincident and coaxial with the substrate vias, with the spacer vias being of larger diameter. Each spacer-equipped module is then adhesively bonded to the others to form a stack. The upper-most spacer-equipped module is fitted with a non-metalized (capping) substrate. In order to electrically interconnect the related traces of all sub-modules, the package is placed in a solder bath, and a partial vacuum is applied simultaneously to one end of all tubes formed from the coincident, stacked vias, filling them with molten solder.

12 Claims, 3 Drawing Sheets

HIGH-DENSITY ELECTRONIC PACKAGE COMPRISING STACKED SUB-MODULES WHICH ARE ELECTRICALLY INTERCONNECTED BY SOLDER-FILLED VIAS

FIELD OF THE INVENTION

This invention relates to semiconductor packaging technology and, more particularly, to multi-chip packages and to techniques for electrically interconnecting stacks of multiple chip carriers.

BACKGROUND OF THE INVENTION

Contemporary integrated circuit devices are typically constructed en masse on a semiconductor wafer of silicon or gallium arsenide. Each device generally takes the form of an integrated circuit (IC) die. If the die is to be encapsulated in a plastic package, it is first bonded to the die-mounting paddle of a leadframe which is attached to other leadframes in a leadframe strip. The wire attachment pads on the die are connected with their corresponding leads on the leadframe with aluminum or gold wire during a wire bonding process, following which the die is coated with a protective polyimide film. Finally, the die is encapsulated in plastic and the plastic-encapsulated chip undergoes a trim and form operation which separates the interconnected packages on the leadframe strip into individual entities and bends (forms) the leads of each package. The package is then recognizable as an IC "chip". The operation for manufacturing plastic-encapsulated packages is highly automated, allowing high quality and low cost.

IC packages take many forms, although the trend is clearly toward designs which increase mounting density. For years, the standard IC package was the dual-inline package or DIP. Such packages were typically through-hole soldered on printed circuit boards. A newer dual-inline lead design, known as small-outline J-lead package, has been rapidly supplanting the standard DIP design for two reasons. Firstly, the leads of an SOJ package are soldered to only one side of a circuit board, thus leaving the other side of the board free for the mounting of additional SOJ packages. Secondly, the leads are much less vulnerable to damage prior to board assembly, hence, there are fewer rejects. Both DIP and SOJ packages are horizontal packages (i.e., the die is mounted in a plane parallel to the board-attachment plane). A vertical package known as the zigzag inline package or ZIP is also coming into greater use. ZIPs are designed for through-hole-soldered connections on a circuit board. Since such packages require very little board area for connection, they are particularly useful where high-density applications are a must. Patents for self-supporting, surface-mount vertical packages have also been issued to Daniel A. Baudouin, et al (U.S. Pat. No. 4,975,763), and to Warren M. Farnworth (U.S. Pat. No. 4,967,262).

Package density may be increased by an order of magnitude by constructing multi-chip packages. Irvine Sensors Corporation (ISC) has been especially active in this field. Several noteworthy multi-chip modules, that have been developed by ISC employees, will be described below.

U.S. Pat. No. 4,983,533, issued to Tiong C. Go, discloses an electronic module comprised of multiple integrated circuit chips stacked on top of the other. The leads for each chip are exposed on one of the four vertical perimetric edges thereof. The chips are adhesively bonded together, with the lead-containing perimetric edges forming an access plane on the module. The exposed leads of the access plane are interconnected via bonding bumps to electrical traces on a substrate layer that is bonded to the access plane of the module. Although it is difficult to conceive of a more dense packaging arrangement, this type of module, although producible in a cost-plus contractual environment, poses a number of daunting problems which raise production costs to levels which are unacceptable in a commercial environment. Firstly, it is costly to produce chips having leads exposed on their edges. Secondly, the access plane must be produced with great precision in order to provide planarity tolerances which result in reliable substrate-to-access plane bonding. Thirdly, it is extremely difficult to cost-effectively burn-in each die before it is incorporated in the module. And fourthly, because of attrition rates associated with each assembly operation, the probability of creating perfect modules from each group of chips is relatively low.

U.S. Pat. No. 4,764,846, also issued to Mr. Go, which are stacked one on top of the other and adhesively bonded to one another. Each sub-module has a cavity, inside which one or more IC chips are located. Each sub-module has a metalization to which input/output pads on the chips(s) is (are) bonded. This metalization pattern extends to at least one edge of the sub-module, where it is exposed for interconnection. Once the various sub-modules have been adhesively bonded together, these pattern-carrying edges form an access plane. The cavity may be formed either by securing a rectangular frame to a chip-carrying substrate, or by etching a cavity in a single piece of material. Like the module of above-referred-to Go patent, the metalization patterns of the various modules are interconnected, via bonding bumps, to electrical traces on a substrate layer that is bonded to the access plane of the module. This module, although it does not achieve density on par with the module created by simply bonding chips together, does provide for reduced production costs, as each sub-module can be thoroughly tested and burned-in before the entire package is assembled. However, it still suffers from assembly attrition related to the module interconnection process and the relatively high costs associated with the edge bonding technique.

What is needed is an improved multi-chip module which features a more reliable and less-costly interconnection technique, which still retains the attribute of individual chip testability prior to module assembly.

SUMMARY OF THE INVENTION

This invention is a high-density electronic package containing multiple integrated circuit chips. It is specifically designed for the packaging of identical memory chips, which share all or most interconnections in common. Dynamic random access memory (DRAM) chips, static random access memory (SRAM) chips and read only memory (ROM) chips are but three types of memory devices which are ideally suited for this application. The package is assembled from sub-modules. Each sub-module comprises a rectangular, wafer-like substrate having a metalization pattern on its upper surface, a single face-bonded IC chip, and a frame-like spacer adhesively bonded to the upper surface of the substrate. The metalization pattern, which comprises multiple conductive traces, is created on the upper surface of the substrate by one of any number of available techniques such as plating followed by an etch, or thick-film screen printing. The single memory chip is face-bonded to the metalization pattern with each of the input, output, power, ground, and various other interconnection pads in electrical communication with one of the traces, using a technique such as the IBM C-4 interconnection process or a Z-axis conductive adhesive interconnection process (Zymet, Inc. and A. I. Technology, Inc. are two suppliers of such adhesive material). In order to eliminate reliability problems caused by incompatible thermal coefficients of expansion (TCE) between the wafer-like substrate and the chip (die) mounted thereon, the wafer-like substrate may be fabricated from a material having the same TCE as the silicon from which the chip was fabricated. Several such materials have been identified in the literature. Each of the metalization traces on the substrate extends from beneath a chip bonding pad, with which it is in electrical communication, and runs to the substrate periphery, where it terminates in a single solderable package interconnection pad (PIP), or branches to terminate in a plurality of PIP's. Each PIP is associated with a single substrate via, which extends through the pad to the lower surface of the substrate. At this stage of assembly, each chip/substrate assembly may be readily tested and burned-in.

During assembly of the package, a frame-like spacer is adhesively bonded to the peripheral upper surface of each chip/substrate assembly to form a completed sub-module. The frame-like spacer perimetrically surrounds the mounted chip. The spacers are at least as thick as an assembled die with associated bond-line thickness (the C4 or Z-axis height above the substrate). The spacer also has a plurality of vias which are coincident and substantially coaxial with the holes of the substrate. However, the holes in the spacers are of larger diameter than those of the substrates. During final assembly, each spacer-equipped module is adhesively bonded to the others to form a stack. The upper-most sub-module is fitted with a capping substrate, which is essentially a substrate without the metalization pattern, since no chip will be mounted on the upper surface thereof. In order to electrically interconnect the related traces of all sub-modules, the package is placed in a solder bath, such that the lower surface of the lower-most sub-module is in contact with the molten solder. A partial vacuum is then applied to the via openings in the capping substrate in order to fill with solder each of the tubes of alternating-diameter sections formed from the coincident stacked vias. Electrical connection with each PIP is made at the base of the spacer via associated with that PIP. Interconnection of the package to larger assemblies, such as pin-grid arrays or circuit boards, is made with solder having a lower melting point than the solder used to interconnect the PIP's of the various sub-modules.

The package is particularly noteworthy because reliable inter-module electrical connections can be achieved with relatively unsophisticated equipment, and without the use of through-hole plating or other complex or costly interconnection techniques.

PREFERRED EMBODIMENT OF THE INVENTION

Figure 1:
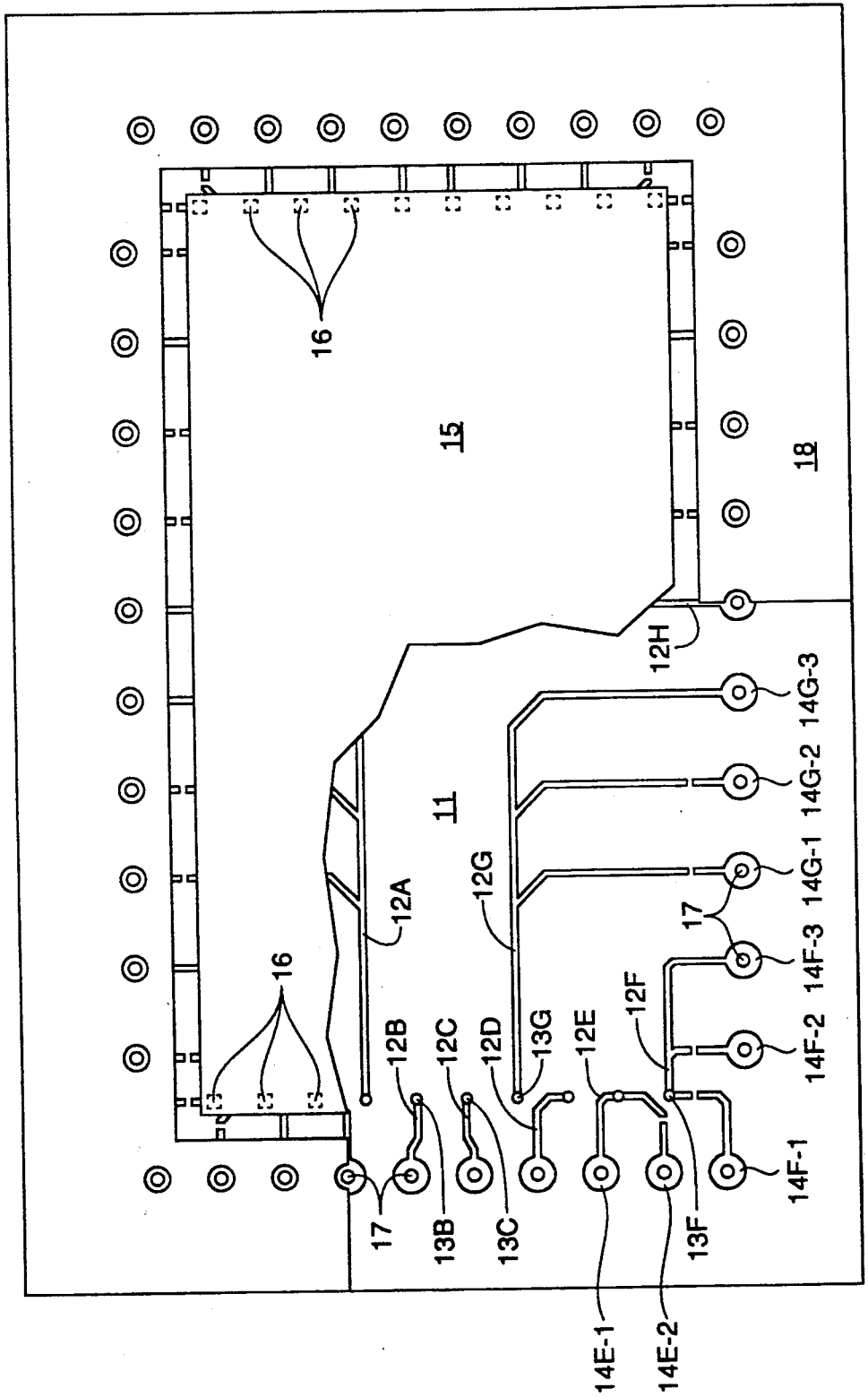
FIG. 1 is a top-plan, partially cut-away view of a sub-module.
Figure 2:
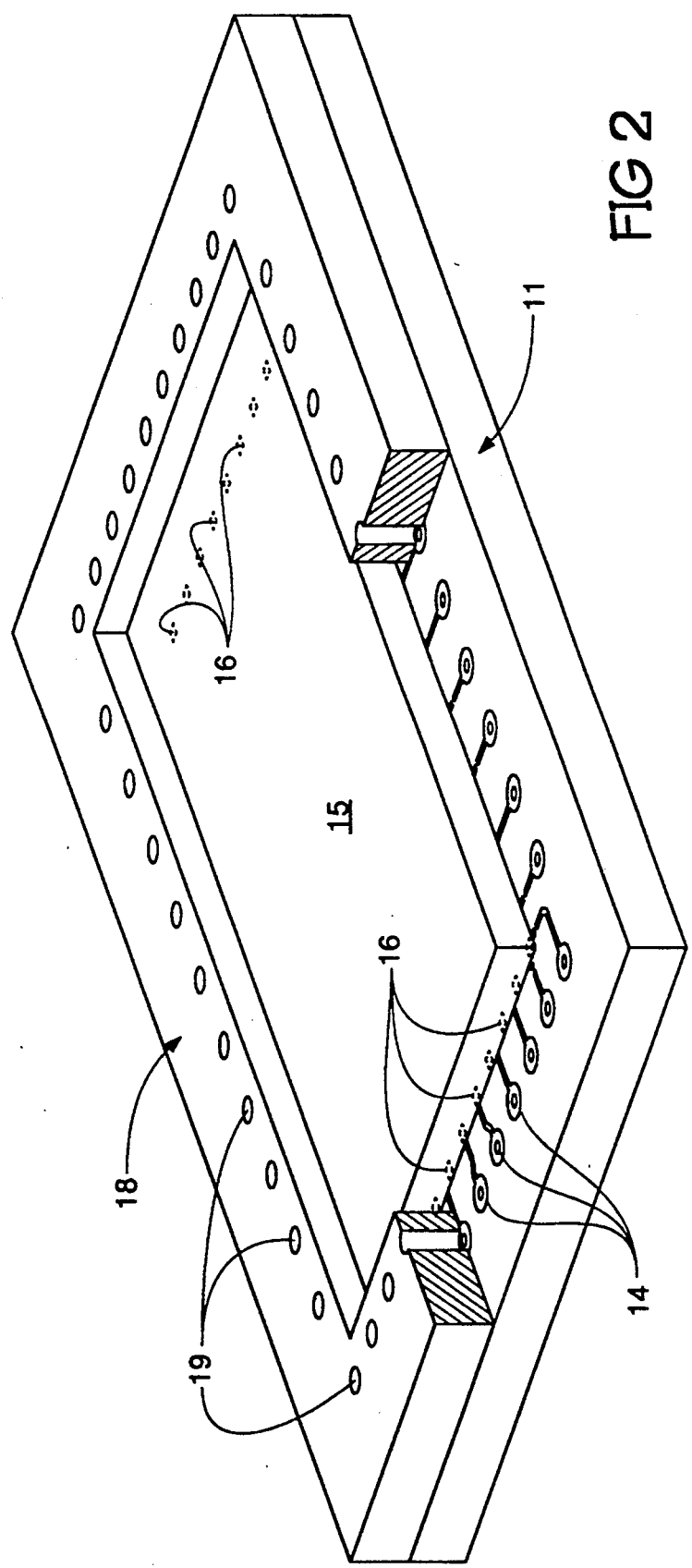
FIG. 2 is an isometric, partially cut-away view of a sub-module.

Referring now to FIGS. 1 and 2, a substantially planar metalization pattern has been created on, and affixed to, the upper planar surface of a rectangular, wafer-like substrate 11 by one of any number of available techniques such as plating followed by an etch, or thick-film screen printing. The metalization pattern consists of multiple traces 12A–12n (n being the total number of traces on the substrate), each of which has a chip-interconnection pad (CIP) 13 and at least one solderable package interconnection pad (PIP) 14. As a note of explanation, those pads associated with a particular trace are identified by the item number followed by the trace-identifying letter. For example, trace 12G has a single CIP (13G) and three PIP's (14G-1, 14G-2 and 14G-3). For the sake of brevity, all traces on the substrate in this drawing have not been numbered. It will be noted that certain traces (e.g., traces 12B, 12C and 12D) have only a single PIP 14, while other traces (e.g., 12E, 12F, and 12G) branch to terminate in two or more PIP's 14. It will be noted that the subtraces leading to PIP's 14E-2, 14F-1, 14F-2, 14G-1, and 14G-2 have been cut. The cutting of subtraces provides a certain element of programmability for individual sub-modules. This feature is useful when identical chips, which are to be incorporated in the package must have one or more interconnections which must be addressed individually or as subgroups.

Still referring to FIGS. 1 and 2, a single memory chip 15 is face-bonded to the metalization pattern with each of the input, output, power, ground, and various other chip bonding pads (CBP's) 16 (only the broken-line outline of the CBP's is shown in FIGS. 1 and 2) being in electrical communication with one of the traces 12A–12n, using a technique such as the IBM controlled-collapse, conductive-connection (C-4) interconnection process or a Z-axis conductive adhesive interconnection process (Zymet, Inc. and A. I. Technology, Inc. are two suppliers of such adhesive material). In order to eliminate reliability problems caused by incompatible thermal expansion coefficients (TECs) between the wafer-like substrate 11 and chip (die) 15 mounted thereon, substrate 11 may be fabricated from a material having the same TEC as the semiconductor material from which the chip was fabricated. Several materials have been identified in the literature as having substantially the same TEC as silicon. Each PIP 14 is associated with a single substrate via 17, the axis of which is perpendicular to the substrate surface, and which extends through the PIP 14 to the lower surface of substrate 11. At this stage of assembly, each chip/substrate assembly, consisting of a substrate 11 and a die 15 face-bonded thereto, may be readily tested and burned-in. Following test and burn-in, a frame-like spacer 18 is adhesively bonded to the upper surface of substrate 11 to create a sub-module. Spacer 18 perimetrically surrounds die 15, with substrate 11 and spacer 18 together forming a cavity in which the die is mounted. It will be noted that one or more subtraces, which branch to terminate in multiple PIP's 14, can be cut even after a spacer 18 has been bonded to a substrate 11, due to the clearance between die 15 and spacer 18. Spacer 18 is at least as thick as an assembled die plus the associated bond-line thickness between it and the substrate 11 (the C4 or Z-axis height above the substrate). It will be noted that spacer 18 has a plurality of spacer vias 19 which are coincident and substantially coaxial with the substrate vias 17. However, the spacer vias 19 are of larger diameter than the substrate vias 17, but of preferably smaller diameter than a PIP 16. This is to ensure adequate electrical interconnect during final assembly, even if slight misalignment has occurred. Additionally, it will ensure that when a spacer 18 is stacked on top of a substrate 11, a portion of the lower surface of the spacer 18 that is circumferential to each spacer via 19 will be resting on a PIP 16, so as to create a substantially airtight seal. It should be noted that reliability problems related to differences in TECs of the various materials used to fabricate the package may be further reduced by fabricating the spacers 18 from the same material used to fabricate the substrates 11.

Figure 3:
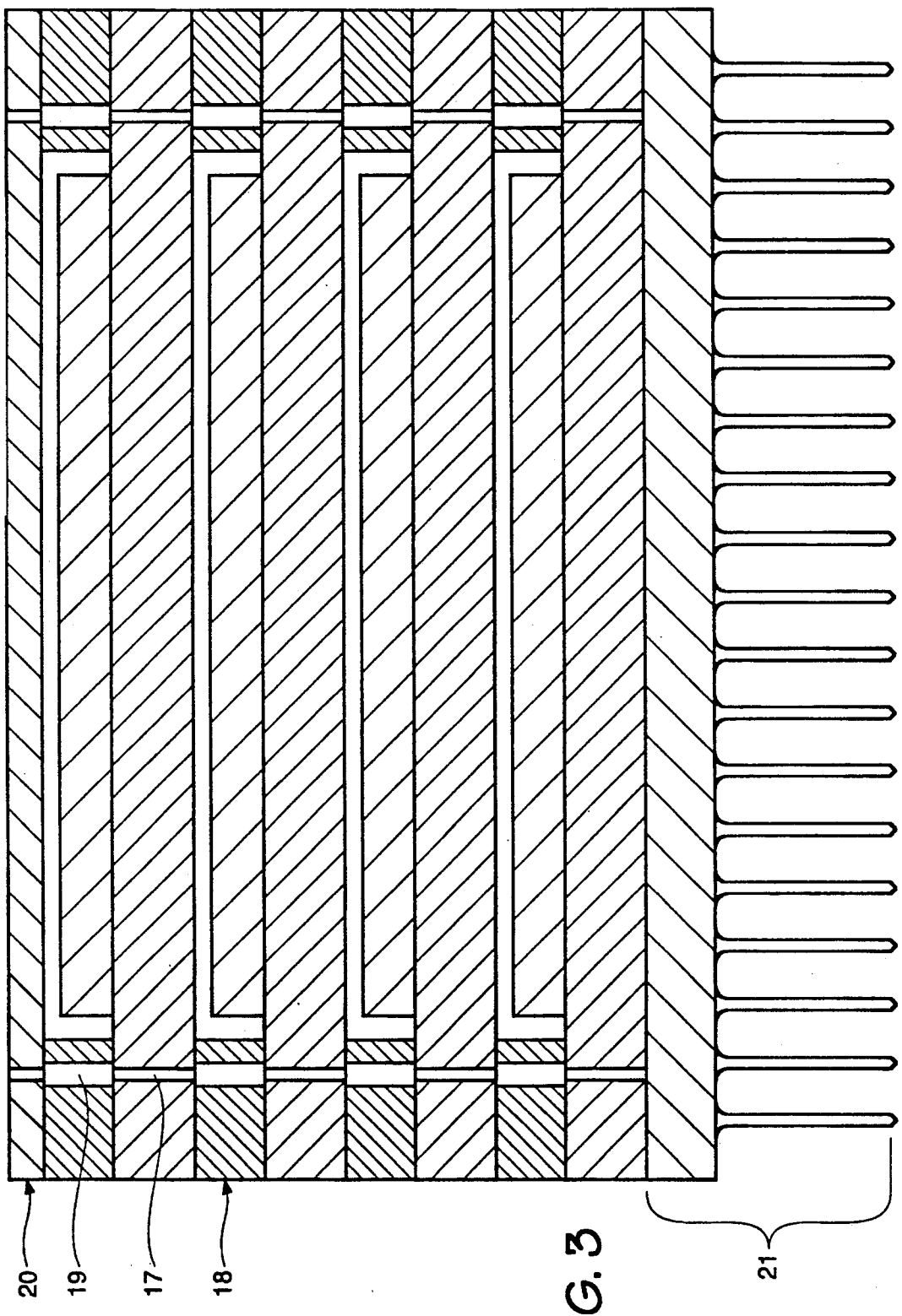
FIG. 3 is a cross-sectional, side-elevational view of a fully assembled package connected to a pin-grid array.

Referring now to FIG. 3, the package is assembled by adhesively bonding sub-modules, one on top of another to form a stack. Adhesive bonding of the spacers 18 to the upper surface of one substrate and the lower surface of another may also occur during final assembly of the package, without the prior formation of sub-modules. Adhesive bonding is preferably accomplished only in the outer perimetral regions of the spacers 18 and the substrates 11. The stack is then preferably compressed so that the adhesive bond width is equal to the height of the metalization pattern on each of the substrates 16. FIG. 3 depicts four such stacked modules interleaved with spacers 18. The upper-most sub-module has been fitted with a capping substrate 20, which is essentially a rectangular substrate without the metalization pattern, since no chip will be mounted on the upper surface thereof (it should be noted that for clarity, the vias in the capping substrate are referred to as capping vias, they are substantially identical to the substrate vias 17). In order to electrically interconnect the related traces of all sub-modules, the package is placed in a solder bath, such that the lower surface of the lower-most sub-module is in contact with the molten solder. Reduced pressure is then applied to the via openings in the capping substrate (at the top of the package) in order to fill with molten solder each of the tubes of alternating-diameter sections formed by the stacked, substrate vias 17 and spacer vias 19. Once the solder has been allowed to solidify within the tubes, the interconnections are permanent. It will be noted that a soldered electrical connection with each PIP 14 is made within the spacer via 19 associated therewith.

Interconnection of the package to larger assemblies, such as pin-grid arrays or circuit boards, is made with solder having a lower melting point than the solder used to interconnect the sub-module traces. Interconnection may be made to the solder in the via openings of either the capping substrate or the lower-most module in the stack. FIG. 3 illustrates, only for the sake of example, an interconnected pin grid array. This is not to be construed as a part of the invention.

Although only a single basic embodiment of the invention has been disclosed herein, it will be obvious to those having ordinary skill in the art of semiconductor packaging technology, that changes and modifications may be made thereto without departing from the invention as claimed. For example, substrates need not be rectangular. However, for the sake of ease of manufacture, such is the preferred embodiment. Although both perfect coaxiality and complete coincidence of stacked vias is theoretically preferred, this is of course impossible, and a certain degree of tolerance is expected. Hence, the word "substantially" has been used as a modifier to indicate the fact that absolute coaxiality of vias is not required. Vias in a stack need be only partially coincident for connections to be successfully made. However, the less process variability, the less the defect rate. A stacked package employing the heretofore-disclosed solder column interconnection technique in combination with sub-modules, each of which is characterized by a chip being mounted by its back side to the substrate and electrical connection between the chip and the metalization pattern on the substrate being made via gold ball, aluminum wedge or tabtape bonding should be considered an equivalent, though inferior embodiment.

We claim:

1. A high-density electronic package comprising a plurality of sub-modules stacked one on top of the other, each of said sub-modules including a wafer-like substrate having upper and lower planar surfaces, a planar metalization pattern affixed to said upper surface to which an integrated circuit chip is bonded, said metalization pattern consisting of conductive traces, each of which leads from a bonding pad on the chip to at least one substrate via which penetrates the substrate perpendicular to said upper and lower surfaces, and a frame-like spacer which is adhesively bonded to the upper surface of said substrate, said spacer having spacer vias which are coincident and substantially coaxial with the substrate vias, said spacer vias being of larger diameter than said substrate vias, and a capping substrate for capping the upper-most of the stacked sub-modules, said capping substrate having capping vias which are coincident with and substantially coaxial with said substrate vias and said spacer vias, but of larger diameter than said substrate vias, and a plurality of solder columns formed within the resulting stacks of coincident substrate, spacer and capping vias, which electrically interconnect traces of the various sub-modules and provide external electrical connection points on the upper surface of the capping module and the lower surface of the lower-most module.

2. The electronic package of claim 1, wherein each of said IC chips is an identical memory chip.

3. A high-density electronic package comprising a plurality of sub-modules, a capping substrate, and a plurality of solder columns which electrically interconnect said sub-modules and provide external electrical connection;

each of said submodules including:
(a) a rectangular, wafer-like substrate, said substrate having a planar metalization pattern affixed to its upper surface, said metalization pattern including conductive traces, each trace having chip interconnection pad (CIP) and at least one solderable package interconnection pad (PIP), said substrate also having a plurality of substrate vias which penetrate the substrate perpendicularly to said upper surface, each PIP at least partially surrounding a single substrate via;
(b) an integrated circuit (IC) chip having a face containing circuitry and exposed bonding pads to access that circuitry, said IC chip being face-bonded to said substrate such that each of said bonding pads is in electrical communication with a single CIP; and
(c) a frame-like spacer adhesively bonded to the peripheral upper surface of each substrate, such that said spacer perimetrically surrounds said IC chip, said spacer having a plurality of spacer vias which are substantially coincident and substantially coaxial with said substrate vias, said spacer vias being of larger diameter than said substrate vias;

said capping substrate having vias substantially identical in size and location to the substrate vias, each of said sub-modules being adhesively bonded to the others so as to form a stack, with said capping substrate being adhesively bonded to the upper-most sub-module, such that the vias of any sub-module and the vias of said capping substrate are substantially coaxial with the corresponding vias of the other sub-modules, and each of said solder columns filling each of tubes of alternating-diameter sections formed by the stacked, coaxial vias.

4. The electronic package of claim 3, wherein each of said IC chips is an identical memory chip.

5. The electronic package of claim 4, wherein external electrical connection is made at the via openings of the lower-most sub-module.

6. The electronic package of claim 4, wherein external electrical connection is made at the via openings of the capping substrate.

7. The electronic package of claim 4, wherein external electrical connection is made at the via openings of both the capping substrate and the lower-most sub-module.

8. The electronic package of claim 4, wherein external electrical connection is made using solder having a lower melting point than the solder used to form the solder columns within the package.

9. The electronic package of claim 4, wherein said IC chip is face bonded to said substrate with a Z-axis conductive adhesive.

10. The electronic package of claim 4, wherein said IC chip is face-bonded to said substrate using the C-4 interconnection process.

11. The electronic package of claim 4, wherein each substrate is fabricated from material having substantially the same TCE as has the semiconductor material from which the IC chips are fabricated.

12. The electronic package of claim 11, wherein said spacers and said substrates are fabricated from the same material.

* * * * *

UNITED STATES PATENT AND TRADEMARK OFFICE
CERTIFICATE OF CORRECTION

PATENT NO. : 5,128,831
DATED : July 7, 1992
INVENTOR(S) : Angus C. Fox, III et al.

It is certified that error appears in the above-indentified patent and that said Letters Patent is hereby corrected as shown below:

Column 2, line 21, after "Mr. Go," and before "which", kindly insert:
-- discloses an electronic module comprised of sub-modules --.

Signed and Sealed this

Fifteenth Day of February, 1994

Attest:

BRUCE LEHMAN

*Attesting Officer*    *Commissioner of Patents and Trademarks*